US012581740B2

(12) United States Patent
Feng et al.

(10) Patent No.: US 12,581,740 B2
(45) Date of Patent: Mar. 17, 2026

(54) ARRAY SUBSTRATE, DISPLAY PANEL, AND DISPLAY DEVICE WITH COMPENSATION SIGNAL NEAR HOLE AREA

(71) Applicant: Hefei Visionox Technology Co., Ltd., Hefei (CN)

(72) Inventors: Hongqing Feng, Hefei (CN); Hongrui Li, Hefei (CN); Lei Mi, Hefei (CN); Xiangtao Zeng, Hefei (CN); Cuili Gai, Hefei (CN); Liwei Ding, Hefei (CN)

(73) Assignee: Hefei Visionox Technology Co., Ltd., Hefei (CN)

( * ) Notice: Subject to any disclaimer, the term of this patent is extended or adjusted under 35 U.S.C. 154(b) by 503 days.

(21) Appl. No.: 18/338,592

(22) Filed: Jun. 21, 2023

(65) Prior Publication Data

US 2023/0343794 A1    Oct. 26, 2023

Related U.S. Application Data

(63) Continuation of application No. PCT/CN2021/124236, filed on Oct. 15, 2021.

(30) Foreign Application Priority Data

Feb. 24, 2021    (CN) .......................... 202110206224.8

(51) Int. Cl.
H10D 86/60        (2025.01)
H10D 86/40        (2025.01)

(52) U.S. Cl.
CPC ........... H10D 86/60 (2025.01); H10D 86/441 (2025.01)

(58) Field of Classification Search
CPC ..... H10D 86/441; H10D 86/60; H10K 59/131
See application file for complete search history.

(56) References Cited

U.S. PATENT DOCUMENTS

2019/0115415 A1*    4/2019    Choi ..................... G06F 3/0412
2019/0121211 A1*    4/2019    Luo ...................... H10K 59/131
(Continued)

FOREIGN PATENT DOCUMENTS

CN        107634072 A        1/2018
CN        109326631 A        2/2019
(Continued)

OTHER PUBLICATIONS

Office Action issued on Jun. 25, 2025 in corresponding Korean Application No. 10-2023-7020207, 20 pages.
(Continued)

*Primary Examiner* — Liliana Cerullo
(74) *Attorney, Agent, or Firm* — Maier & Maier, PLLC

(57) ABSTRACT

An array substrate, a display panel and a display device. The array substrate includes: a hole area and a display area which is partially surrounding the hole area; a plurality of first signal lines located in the display area and including a plurality of first category signal lines and a plurality of second category signal lines; a plurality of first connection signal lines, each of which includes a first connection section, a second connection section and a third connection section that are connected sequentially; and a plurality of first compensation signal lines located in the display area and extending in the second direction, wherein at least a portion of the plurality first compensation signal lines is located on the extension of the first connection signal lines in the second direction.

20 Claims, 9 Drawing Sheets

(56)     References Cited

U.S. PATENT DOCUMENTS

| | | | | |
|---|---|---|---|---|
| 2019/0214596 | A1* | 7/2019 | Park | G06F 3/0412 |
| 2020/0064702 | A1* | 2/2020 | Yeh | G02F 1/136286 |
| 2020/0227505 | A1* | 7/2020 | Kim | H10K 59/80 |
| 2022/0069052 | A1* | 3/2022 | Liu | H10K 59/121 |
| 2022/0157860 | A1* | 5/2022 | Zhu | H10D 86/411 |
| 2022/0320231 | A1* | 10/2022 | Zhang | H10K 59/88 |

FOREIGN PATENT DOCUMENTS

| | | | |
|---|---|---|---|
| CN | 109541867 | A | 3/2019 |
| CN | 111312152 | A | 6/2020 |
| CN | 111834425 | A | 10/2020 |
| CN | 112198990 | A | 1/2021 |
| CN | 113160743 | A | 7/2021 |
| KR | 1020190041553 | A | 4/2019 |

OTHER PUBLICATIONS

International Search Report issued on Dec. 1, 2021, in corresponding International Patent Application No. PCT/CN2021/124236, 6 pages.
Office Action issued Mar. 22, 2022, in corresponding Chinese Patent Application No. 202110206224.8, 13 pages.
Rejection Decision issued Jul. 1, 2022, in corresponding Chinese Patent Application No. 202110206224.8, 5 pages.
Reexamination Decision issued Nov. 17, 2022, in corresponding Chinese Patent Application No. 202110206224.8, 2 pages.

* cited by examiner

AA

BB

ARRAY SUBSTRATE, DISPLAY PANEL, AND DISPLAY DEVICE WITH COMPENSATION SIGNAL NEAR HOLE AREA

CROSS REFERENCE TO RELATED APPLICATIONS

The present application is a continuation of International Application No. PCT/CN2021/124236 filed on Oct. 15, 2021, which claims the benefit of priority to Chinese Patent Application No. 202110206224.8 filed on Feb. 24, 2021, and entitled "ARRAY SUBSTRATE, DISPLAY PANEL, AND DISPLAY DEVICE", both of which are incorporated herein by reference in their entireties.

TECHNICAL FIELD

The present application relates to the field of display technology, in particular to an array substrate, a display panel and a display device.

BACKGROUND

With rapid development of electronic devices, users have higher and higher requirements on a screen-to-body ratio. In related arts, a traditional electronic device such as a mobile phone and a tablet has a notch or hole in a display screen for allowing external light to be directed onto photosensitive components under the screen, in order to meet requirements of integration of a component such as a front camera, an earphone and an infrared sensor, or the like. Since signal lines around the notch or hole need to be connected in a one-to-one correspondence, there requires a large wiring space around the notch or hole, which affects the screen-to-body ratio of the display screen.

SUMMARY

The embodiments of present application provides an array substrate, a display panel and a display device, which can increase a screen-to-body ratio of a display area and improve display effects.

In a first aspect, the embodiments of the present application provides an array substrate including a hole area and a display area which is partially surrounding the hole area, the array substrate including: a plurality of first signal lines located in the display area and including a plurality of first category signal lines and a plurality of second category signal lines, wherein each of the first category signal lines extends in a first direction, and each of the second category signal lines includes a first section and a second section separated by the hole area and extending in the first direction; a plurality of first connection signal lines, at least a portion of which is located in the display area but in a different film layer from the first category signal lines, wherein each of the first connection signal lines includes a first connection section, a second connection section and a third connection section that are connected sequentially, the second connection section is connected between the first connection section and the third connection section, the first connection section is electrically connected to the first section, the third connection section is electrically connected to the second section, and both the first connection section and the third connection section extend in a second direction; and a plurality of first compensation signal lines located in the display area and extending in the second direction, wherein at least a portion of the plurality first compensation signal lines is located on the extension of the first connection signal lines in the second direction.

In a second aspect, the embodiments of the present application provides a display panel, including the array substrate according to any of embodiments of the first aspect.

In a third aspect, the embodiments of the present application provides a display device, including the display panel according to any of embodiments of the second aspect.

DETAILED DESCRIPTION

Detailed description of features and exemplary embodiments of various aspects of the present application will be provided below. In order to make purpose, technical solutions, and advantages of the present application clearer, the present application will be described in detail in conjunction with accompanying drawings and specific embodiments. It should be understood that the specific embodiments described here are only provided to explain the present application and not to limit the present application. For those skilled in the art, the present application can be implemented without some of these specific details. The description of the embodiments below is only intended to provide a better understanding of the present application by showing examples of the present application.

Figure 1:
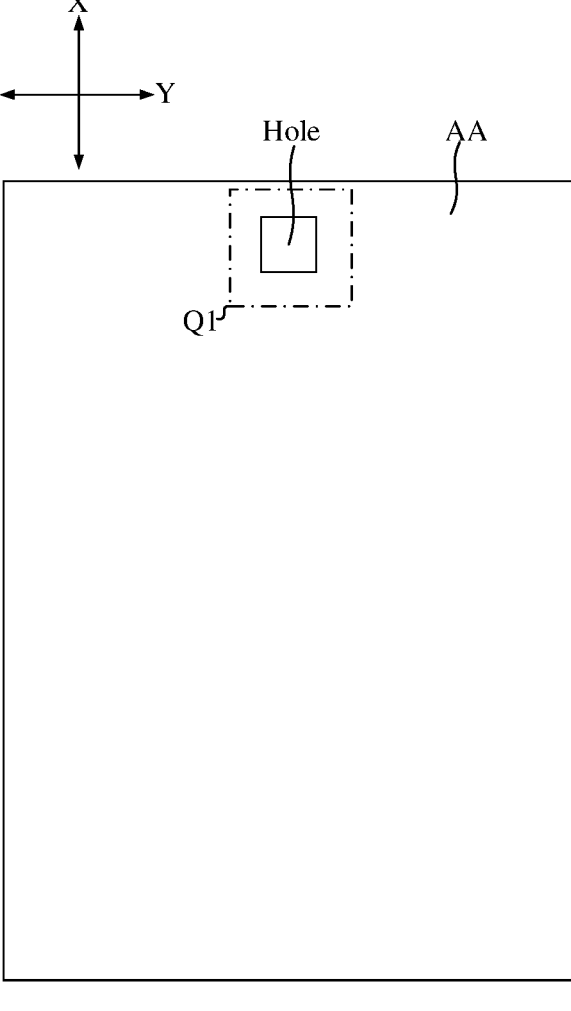
FIG. 1 shows a schematic top view of an array substrate according to an embodiment of the present application.
Figure 2:
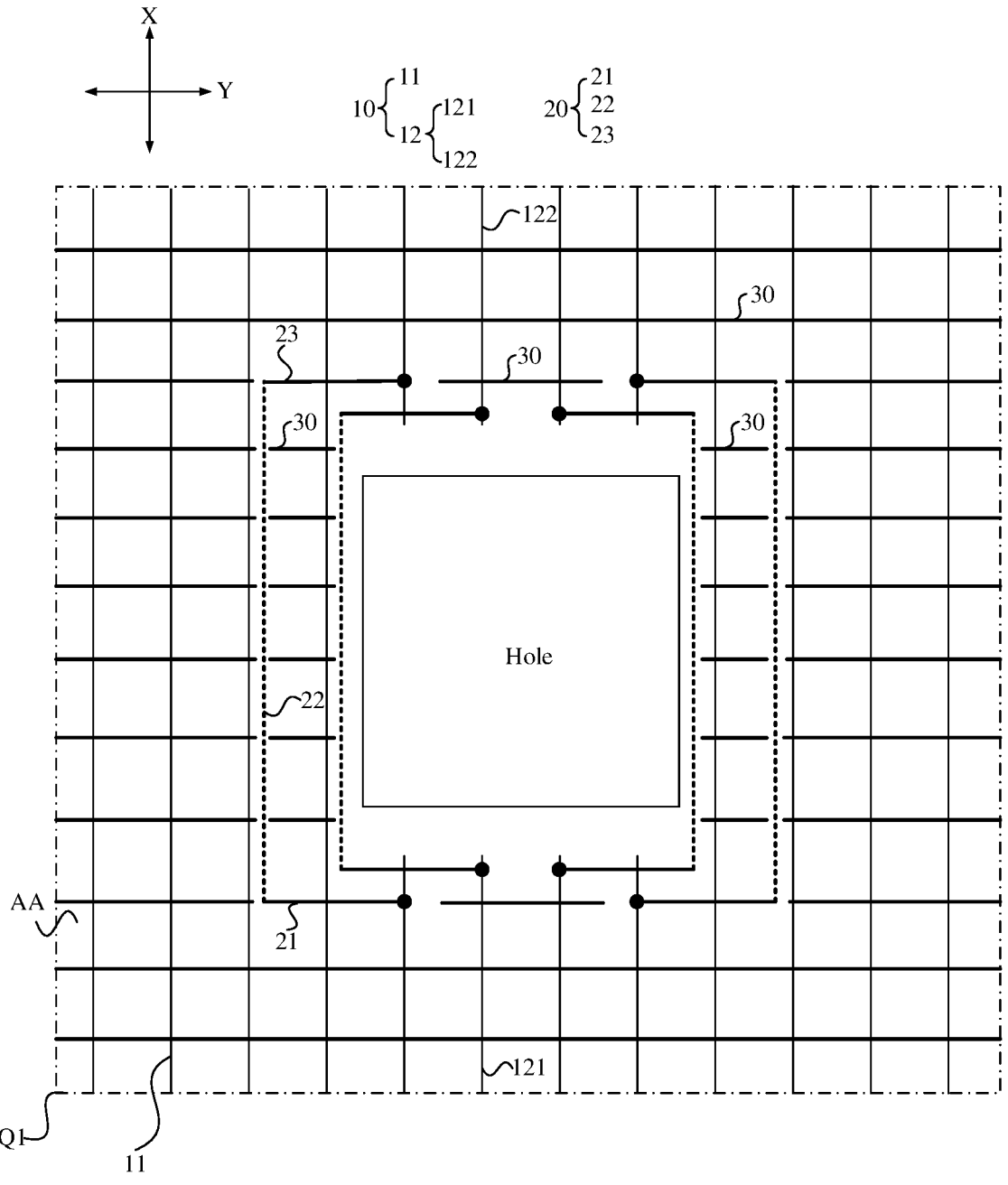
FIG. 2 shows an enlarged schematic diagram of the Q1 region in FIG. 1.

FIG. 1 shows a schematic top view of an array substrate according to an embodiment of the present application. FIG. 2 shows an enlarged schematic diagram of the Q1 region in FIG. 1. As shown in FIGS. 1 and 2, the embodiment of the present application provides an array substrate 100 which has a hole area Hole and a display area AA surrounding the hole area Hole.

The hole area Hole may also be referred to as an opening area, a slot area, a blind hole area, a through hole area, or the like, for example. The present application is not limited in this aspect. The hole area Hole is provided to place a photosensitive component. The photosensitive component may be an image acquisition device for collecting external image information. For example, the photosensitive component may be a camera, or the like. The photosensitive component is not be limited to the image acquisition device, and in some embodiments, the photosensitive component may be an optical sensor such as an infrared sensor, a proximity sensor, an infrared lens, a flood illuminator, an ambient light sensor, and a dot projector.

The hole area Hole may be a rectangular, circular, elliptical, or square area, and its shape can be set according to actual needs. The present application is not limited in this aspect.

It should be understood that the hole area Hole is a non-display area.

The display area AA is provided with pixel circuits in an array (not shown in the figure) for driving light-emitting elements and signal lines electrically connected to the pixel circuits.

As shown in FIGS. 1 and 2, the array substrate 100 includes first signal lines 10, first connection signal lines 20, and first compensation signal lines 30. The plurality of first signal lines 10 are located in the display area AA. The plurality of first signal lines 10 include a plurality of first category signal lines 11 and a plurality of second category signal lines 12. Each of the first category signal lines 11 extends in a first direction X. Each of the second category signal lines 12 includes a first section 121 and a second section 122 separated by the hole area Hole and extending in the first direction X.

The first signal line is electrically connected to a pixel circuit (not shown in the figure). For example, an orthogonal projection of the first signal line 10 on a plane where the array substrate is located may overlap with an orthogonal projection of the pixel circuit on the plane where the array substrate is located. An orthogonal projection of the first connection signal line 20 on the plane where the array substrate is located may also overlap with the orthogonal projection of the pixel circuit on the plane where the array substrate is located. An orthogonal projection of the first compensation signal line 30 on the plane where the array substrate is located may also overlap with the orthogonal projection of the pixel circuit on the plane where the array substrate is located.

It should be understood that each of the first category signal lines 11 is a continuing line, and is not separated by the hole area Hole.

In order to provide signals for pixel driver circuits which are electrically connected to a same second category signal line 12, the first connection signal lines 20 are provided to connect the separated first section 121 and second section 122.

Exemplarily, at least a portion of the first connection signal lines 20 are located in the display area AA but in a different film layer from the first category signal lines 11. Each of the first connection signal lines 20 includes a first connection section 21, a second connection section 22, and a third connection section 23 that are connected sequentially. The second connection section 22 is connected between the first connection section 21 and the third connection section 23. The first connection section 21 is electrically connected to the first section 121 (the connection is indicated by a black dot in the figure). The third connection section 23 is electrically connected to the second section 122 (the connection is indicated by a black dot in the figure). Both the first connection section 21 and the third connection section 23 extend in a second direction Y, while the second connection section 22 extends in the first direction X. In order to clearly distinguish the first signal line 10 from the second connection section 22, the second connection section 22 is shown by a dashed line in the figure.

The plurality of first compensation signal lines 30 are located in the display area AA and extend in the second direction Y. An orthographic projection of the first compensation signal line 30 on the plane where the array substrate 100 is located does not overlap with an orthographic projection of the first connection section 21 on the plane where the array substrate 100 is located, and does not overlap with an orthographic projection of the third connection section 23 on the plane where the array substrate 100 is located. At least a portion of the plurality first compensation signal lines 30 is located on the extension of the first connection signal lines 20 in the second direction Y. It should be understood that the first compensation signal lines 30 are provided in regions of the display area AA other than those regions where the first connection sections 21 and the third connection sections 23 are located. Exemplarily, a portion of the plurality first compensation signal lines 30 may be located between adjacent first connection sections 21, and/or a portion of the plurality first compensation signal lines 30 may be located between adjacent third connection sections 23. Exemplarily, a portion of the plurality first compensation signal lines 30 is aligned with the first connection section 21 in the second direction Y, and/or a portion of the plurality first compensation signal lines 30 is aligned with the third connection section 23 in the second direction Y.

In the embodiment of the present application, since at least a portion of the first connection signal lines 20 are provided in the display area AA but in a different film layer from the first category signal lines 11, the number of the first connection signal lines 20 provided at an outer edge of the hole area Hole can be reduced, and even there is no the first connection signal line 20 at the outer edge of the hole area Hole. Therefore, the outer edge of the hole area Hole can be reduced, and the screen to-body ratio of the array substrate can be increased.

Figure 3:
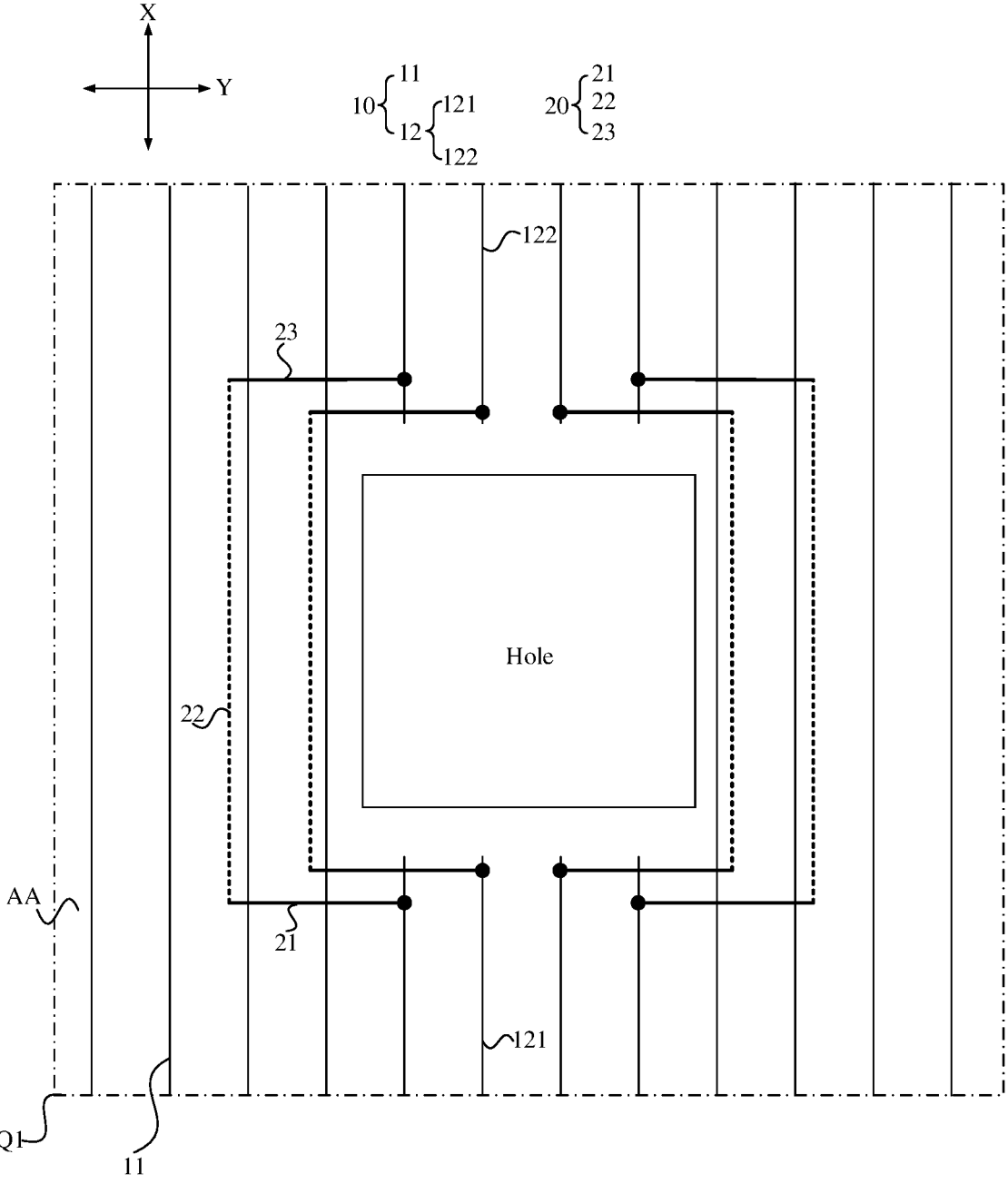
FIG. 3 shows an enlarged schematic diagram of a comparative example of the Q1 region in FIG. 1.

As shown in FIG. 3, since each of the first connection signal lines 20 includes the first connection section 21 and the third connection section 23 that extend in the second direction Y, wiring density in a region of the display area which is occupied by the first connection sections 21 and the third connection sections 23 in the second direction Y is higher than that of other regions of the display area in the second direction Y. Due to different wiring densities in different regions of the display area in the second direction Y, there may be issues such as uneven display (such as mura) when the array substrate drives light-emitting elements for display.

The array substrate according to the embodiments of the present application further includes the first compensation signal lines 30 which extend in the second direction Y and located in regions of the display area AA other than those regions where the first connection sections 21 and the third connection sections 23 are located. At least a portion of the plurality first compensation signal lines 30 is located on the extension of the first connection signal lines 20 in the second direction Y. Further, the first compensation signal lines 30, the first connection sections 21 and the third connection sections 23 all extend along the second direction Y, which results in a consistent wiring density through the entire display area AA in the second direction Y, thereby avoiding the problem of uneven display (such as mura).

Exemplary, the first direction X intersects with the second direction Y. The first direction X and the second direction Y may be perpendicular with each other. For example, the first direction X may be a column direction, the second direction Y may be a row direction, and the first signal line 10 may be a data signal line (Data line). As another example, the first direction X may be the row direction, the second direction Y may be the column direction, and the first signal line 10 may be a scan signal line (Scan line), an light emission control signal line (Emit line), or a reference voltage signal line (Vref line). The present application is not limited in this aspect.

In some optional embodiments, in the first direction X, a line spacing between adjacent first compensation signal lines 30, a line spacing between adjacent first connection sections 21, and a line spacing between adjacent third connection sections 23 may be equal with each other, and a line width of the first compensation signal line 30, a line width of the first connection section 21, and a line width of the third connection section 23 may be equal with each other.

The plurality of first compensation signal lines 30, the first connection sections 21 of the plurality of first connection signal lines 20, and the third connection sections 23 of the plurality of first connection signal lines 20 are uniformly distributed in the display area AA along the first direction X. That is to say, the plurality of the first compensation signal lines 30, the plurality of the first connection sections 21, and the plurality of the third connection sections 23 are uniformly distributed in the first direction X. Due to the fact that the first compensation signal lines 30, the first connection sections 21, and the third connection sections 23 all extend in the second direction Y, have equal line widths and are distributed uniformly, wiring density of the entire display area AA in the second direction Y can be made further consistent.

Exemplarily, in the first direction X, a line spacing between a first compensation signal line 30 and an adjacent first connection section 21 may be equal to a line spacing between adjacent first compensation signal lines 30 and/or a line spacing between adjacent first connection sections 21. In the first direction X, a line spacing between a first compensation signal line 30 and an adjacent third connection section 23 may be equal to the line spacing between adjacent first compensation signal lines 30 and/or a line spacing between adjacent third connection sections 23.

For example, the first connection section 21 and the third connection section 23 are respectively located on an extension line of a corresponding first compensation signal line 30. In other words, there are two first compensation signal lines 30 at both sides of the first connection section 21 and the third connection section 23 in the second direction Y, and an extending line of the two first compensation signal lines 30 passes through the first connection section 21 and/or the third connection section 23.

If the first compensation signal line 30 is not connected to other signal lines, parasitic capacitance will be generated between the first compensation signal line 30 and the other signal lines, affecting signal stability and thus affecting display stability.

Figure 4:
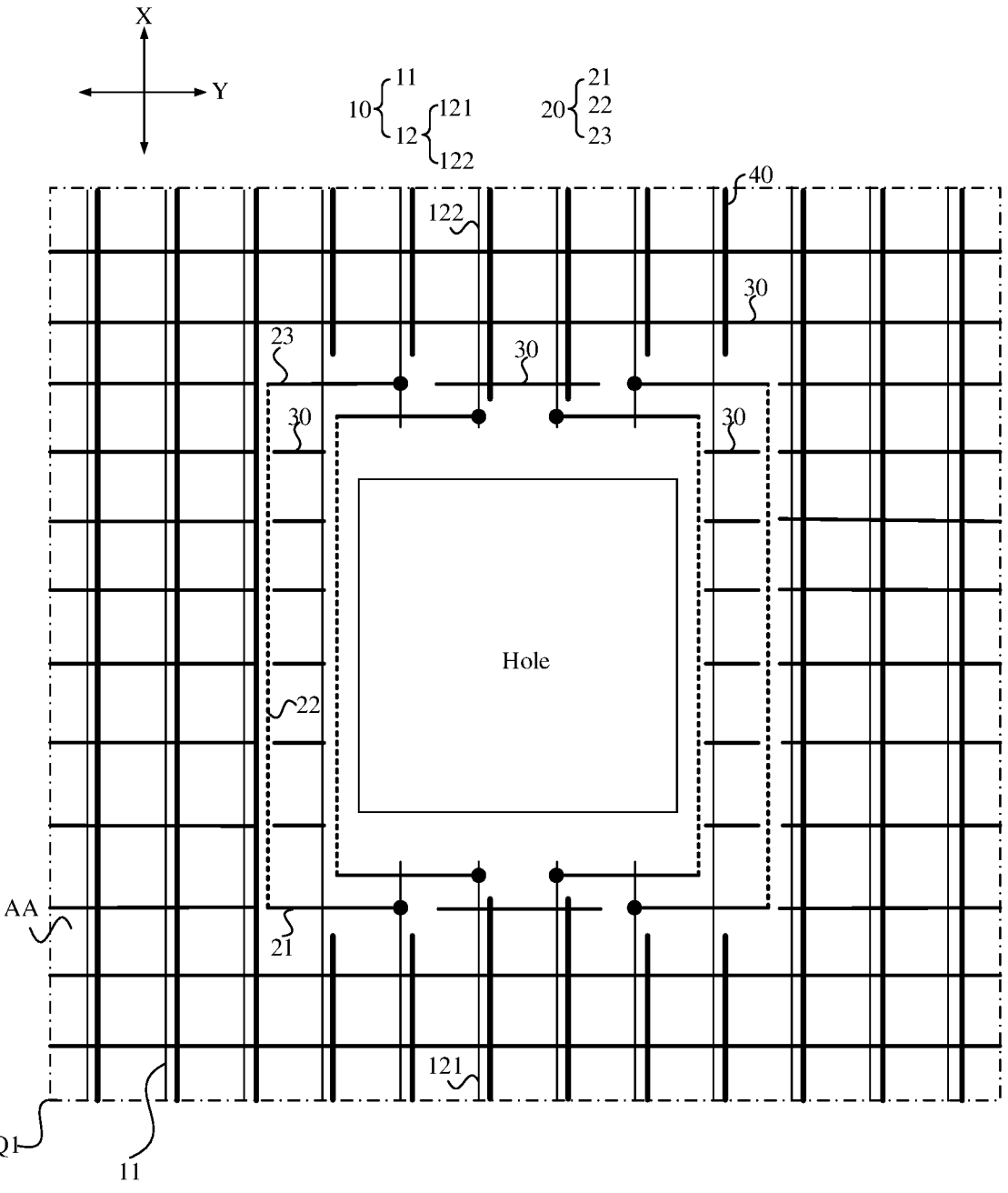
FIG. 4 shows another enlarged schematic diagram of the Q1 region in FIG. 1.

In some optional embodiments, as shown in FIG. 4, the array substrate 100 may further include a plurality of second signal lines 40. The plurality of second signal lines 40 are located in the display area AA, and at least a portion of the plurality of first compensation signal lines 30 is electrically connected to the second signal line 40. The second signal line 40 may be a voltage signal line. According to the embodiments of the present application, on one hand, since the first compensation signal lines 30 are electrically connected to the second signal lines 40, formation of parasitic capacitance with the first compensation signal lines 30 can be avoid, and thus display stability can be improved; on the other hand, since the second signal lines 40 are voltage signal lines, a mesh of the second signal lines 40 are formed after being electrically connected to the first compensation signal lines 30, which increase an area occupied by wirings of the second signal lines 40, thereby resistance of the second signal lines 40 can be reduced and a voltage drop (IR drop) of the second signal lines 40 can be lowered.

For example, the second signal line 40 may be a power signal line (Vdd line) or a reference voltage signal line (Vref line). The present application is not limited in this aspect.

Figure 5:
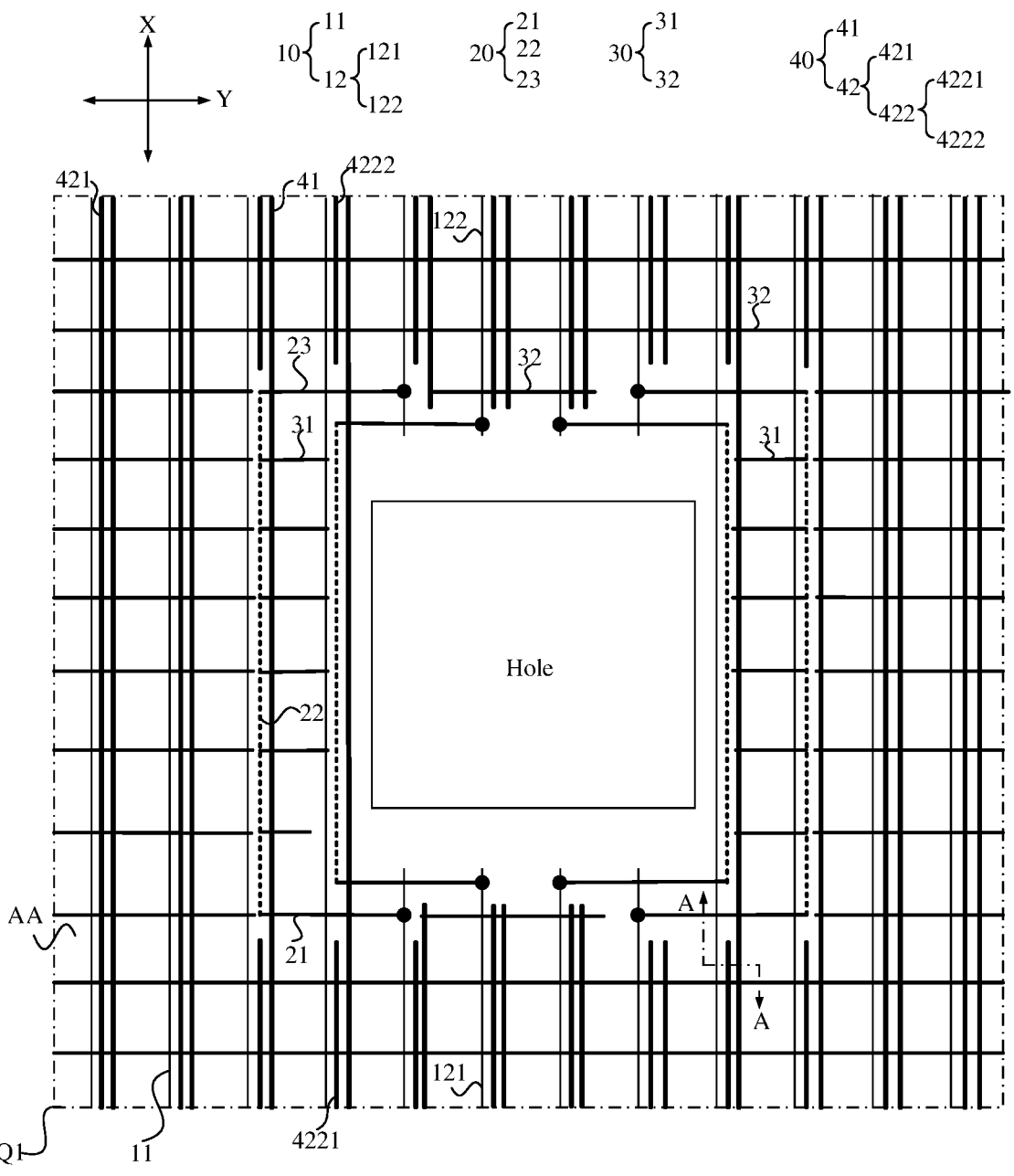
FIG. 5 shows another enlarged schematic diagram of the Q1 region in FIG. 1.

In some optional embodiments, the second signal line 40 is a power signal line. As shown in FIG. 5, each of the second signal line 40 includes a first sub-signal line 41 and a second sub-signal line 42 which are electrically connected to each other but located in different film layers. The first sub signal line 41 and the second sub signal line 42 may be connected through a via. At least a portion of the plurality first compensation signal lines 30 is located in a same film layer as and electrically connected to one of the first sub-signal line 41 and the second sub-signal line 42.

As an example, an orthogonal projection of the first sub-signal line 41 on the plane of the array substrate is located may overlap with an orthogonal projection of the second sub-signal line 41 on the plane of the array substrate is located. The orthographic projection of the first sub signal line 41 on the plane where the array substrate is located may completely overlap with the orthogonal projection of the second sub-signal line 41 on the plane of the array substrate is located. In order to clearly show the first sub-signal lines 41 and second sub signal lines 42, FIG. 5 shows the orthogonal projection of the first sub-signal lines 41 on the plane where the array substrate is located does not overlap with the orthogonal projection of the second sub-signal line 41 on the plane of the array substrate is located. The schematic representation of the first and second sub-signal lines 41 and 42 in FIG. 5 is not intended to limit the present application. In addition, in FIG. 5, a dotted line is used to indicate a connection relationship between the first sub-signal line 41 and the second sub-signal line 42.

In the embodiments of the present application, by setting the second signal line 40 with two sub-signal lines being located in different film layers, an equivalent parallel structure of the two sub-signal lines can further reduce the resistance of the second signal line 40 and thereby further reduce the voltage drop of the second signal line 40. In addition, the first compensation signal line 30 is located in a same film layer as one of the first sub-signal line 41 and the second sub-signal line 42, so the first compensation signal line 30 and one sub-signal line of the second signal line 40 can be formed simultaneously in a same process step, which can save process steps.

In some optional embodiments, still referring FIG. 5, first direction X is a column direction, the second direction Y is a row direction, the first signal line 10 is the data signal line, the second signal line 40 extends in the first direction X, and the second signal line 40 is a power signal line.

Figure 6:
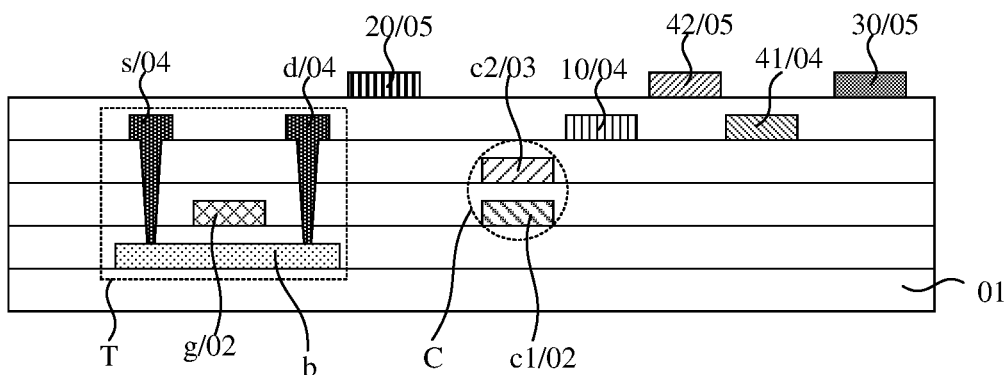
FIG. 6 shows a schematic sectional view along the A-A direction in FIG. 5.

As shown in FIG. 6, the first signal line 10 is located in a same film layer as the first sub-signal line 41 but with a separation distance from the first sub-signal line 41, while the first compensation signal line 30 and the first connection signal line 20 are provided in a same film layer as the second sub-signal line 42. In this way, the first signal line 10 and the first sub-signal line 41 can be formed simultaneously in a same process step, and the first compensation signal line 30, the first connection signal line 20 and the second sub signal line 42 can be formed simultaneously in a same process step, which can save process steps.

Exemplarily, the array substrate 100 may include a substrate 01 and a first conductive layer 02, a second conductive layer 03, a third conductive layer 04, and a fourth conductive layer 05 which are stacked on one side of the substrate 01. Insulation layers are interpositioned between adjacent conductive layers. Exemplarily, a pixel driving circuit of the array substrate 100 includes a transistor T and a storage capacitor C. The transistor T includes a semiconductor b, a gate terminal g, a source terminal s, and a drain terminal d. The storage capacitor C includes a first electrode plate c1 and a second electrode plate c2. As an example, the gate terminal g and the first plate c1 may be located in the first conductive layer 02, the second plate c2 may be located in the second conductive layer 03, the source terminal s, the drain terminal d, the first signal line 10, and the first sub-signal line 41 may be located in the third conductive layer 04, and the first compensation signal line 30, the first connection signal line 20, and second sub-signal line 42 may be located in the fourth conductive layer 05. It should be understood that the first connection section 21, the second connection section 22 and the third connection section 23 of the first connection signal line 20 may be all located in the fourth conductive layer 05.

Still referring to FIG. 5, the second sub-signal line 42 includes the first category sub-signal line 421 and the second category sub-signal line 422. The second category sub-signal line 422 includes a first sub-section 4221 and a second sub-section 4222 which are separated by the first connection signal line 20, and at least a portion of the second connection sections 22 extends between the first sub-section 4221 and the second sub-section 4222. Exemplarily, an orthographic projection of the second connection section 22 on the plane where the array substrate is located and an orthographic projection of the first sub-signal line 41 on the plane where the array substrate is located may overlap with each other. In order to clearly illustrate the signal lines, FIG. 5 shows the orthogonal projection of the second connection section 22 on the plane where the array substrate is located does not overlap with the orthogonal projection of the first sub-signal line 41 on the plane where the array substrate is located, which is not intended to limit the present application.

According to the embodiments of the present application, since the second connection section 22 extends between the first sub-section 4221 and the second sub-section 4222, the second connection section 22 together with the first sub section 4221 and the second sub-section 4222 is equivalent to a first category sub-signal line 421, resulting in a consistent density through the entire display area AA in the first direction X, further avoiding the problem of uneven display (such as mura).

In some optional embodiments, still referring to FIG. 5, the first compensation signal line 30 includes a first category compensation signal line 31 and a second category compensation signal line 32. The first category compensation signal line 31 is located between the first connection signal line 20 and the hole area Hole, and there is a first connection signal line 20 between the second category compensation signal line 32 and the hole area Hole. The first category compensation signal line 31 is connected to the first connection signal line 20, and the second category compensation signal line 32 is connected to the second sub-signal line 40.

Due to the fact that the first category compensation signal line 31 is located between the first connection signal line 20 and the hole area Hole, if all the first category compensation signal lines 31 were connected to the second sub-signal lines 40, it would be necessary to provide through holes. By connecting the first category compensation signal line 31 to the first connection signal line 20, it is not necessary to make through holes and process steps can be simplified.

Figure 7:
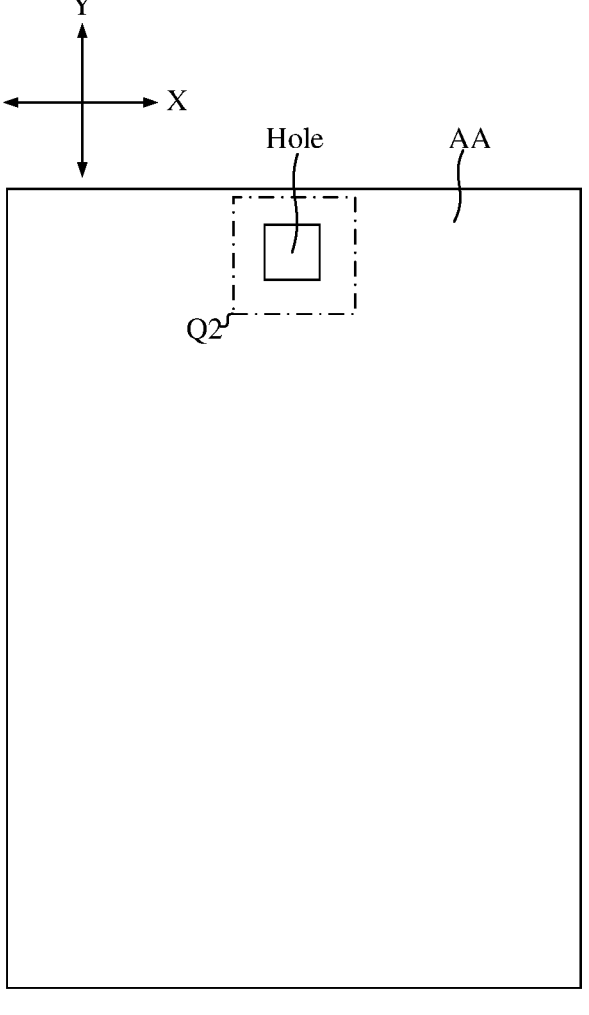
FIG. 7 shows a schematic top view of another array substrate according to an embodiment of the present application.
Figure 8:
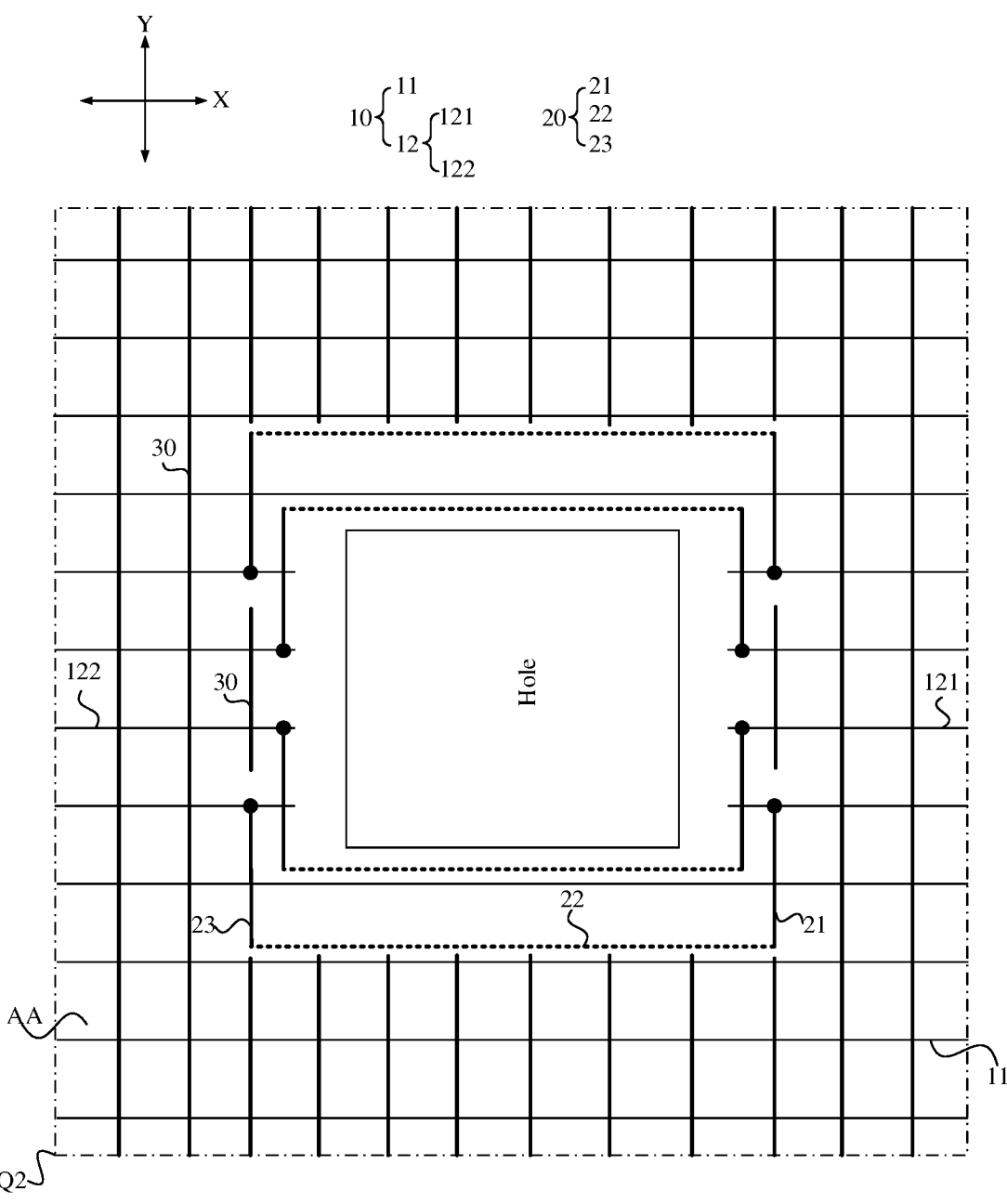
FIG. 8 shows an enlarged schematic diagram of the Q2 region in FIG. 7.

FIGS. 1 to 5 take the first direction X as the column direction and the second direction Y as the row direction as an example. In other optional embodiments, as shown in FIGS. 7 and 8, the first direction X may be the row direction, and the second direction Y may be the column direction. Each of the first signal lines 10 may be a scanning signal line, a light emission control signal line, or a reference voltage signal line, and each of the second signal lines 40 may extend in the second direction. The first signal lines 10 and the second signal lines 40 are located in different film layers. Due to different extension directions of the first signal lines 10 and the second signal lines 40, the first signal lines 10 and the second signal lines 40 are provided in different film layers to avoid signal crosstalk.

Figure 9:
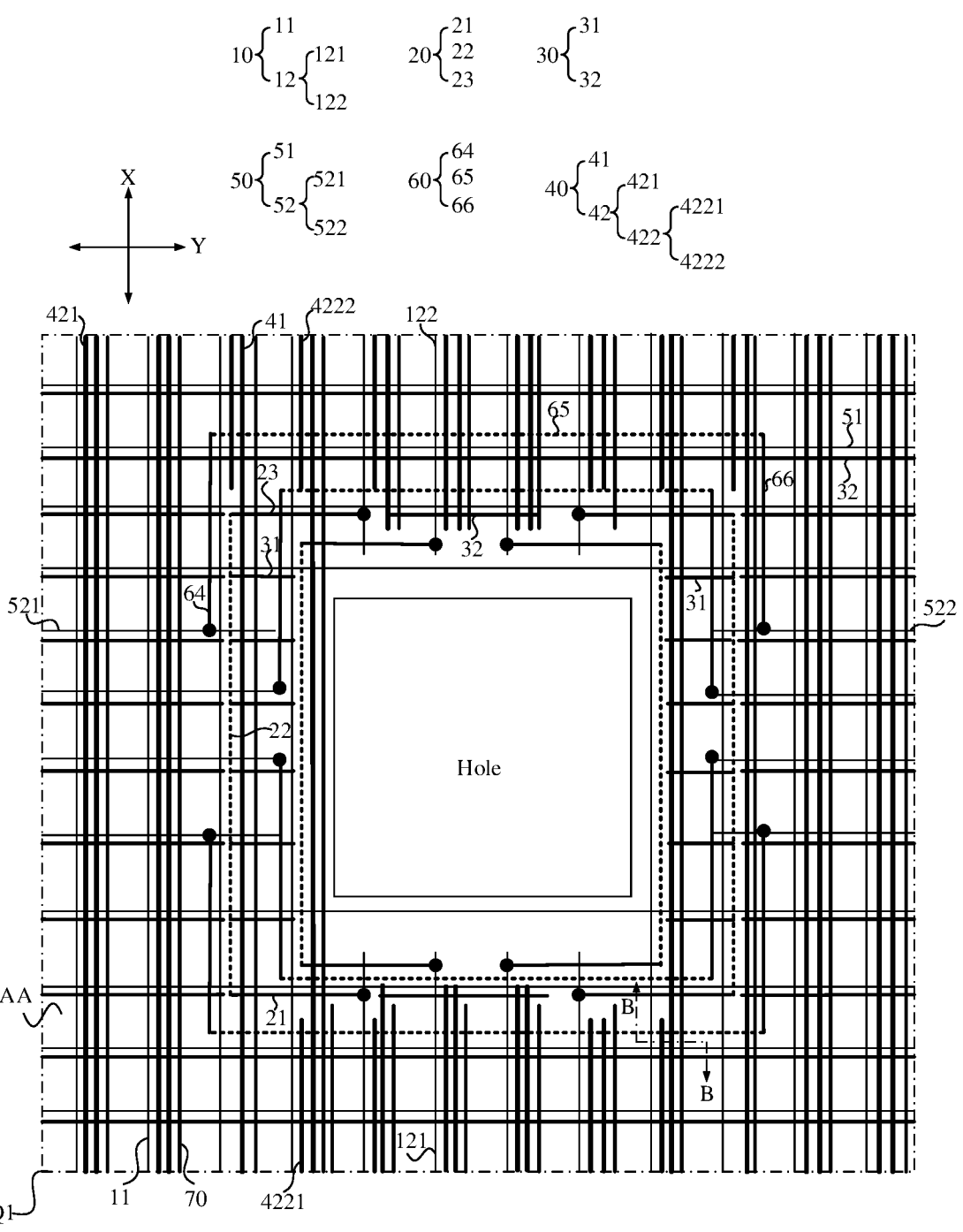
FIG. 9 shows another enlarged schematic diagram of the Q1 region in FIG. 1.

In some optional embodiments, as shown in FIGS. 1 and 9, the first direction X is the column direction, the second direction Y is the row direction, the first signal line 10 is a data signal line, and the array substrate may further includes third signal lines 50, second connection signal lines 60, and second compensation signal lines 70.

The third signal line 50 is a scanning signal line, a light emission control signal line, or a reference voltage signal line. The plurality of third signal lines 50 include a plurality of third category signal lines 51 and a plurality of fourth category signal lines 52, wherein each of each of the third category signal lines is located in the display area and extends in the second direction Y. Each of the fourth category signal lines 52 includes a third section 521 and a fourth section 522 separated by the hole area Hole and extending in the second direction Y.

The third signal line is electrically connected to a pixel circuit (not shown in the figure). Exemplarily, an orthographic projection of the third signal line 50 on the plane where the array substrate is located overlaps with an orthographic projection of the pixel circuit on the plane where the array substrate is located. An orthographic projection of the second connection signal line 60 on the plane where the array substrate is located may also overlap with the orthographic projection of the pixel circuit on the plane where the array substrate is located. An orthographic projection of the second compensation signal line 70 on the plane where the array substrate is located may also overlap with the orthographic projection of the pixel circuit on the plane where the array substrate is located.

It should be understood that each of the third category signal line 51 is a continuing line, and each of the third category signal line 51 is not separated by the hole area Hole.

In order to provide signals for pixel driver circuit which are electrically connected to a same fourth category signal line 52, the second connection signal lines 60 are provided to connect the separated third section 521 and fourth section 522.

Exemplarily, at least a portion of the second connection signal lines 60 are located in the display area AA but in different film layers from the third category signal lines 51. Each of the second connection signal lines 60 includes a fourth connection section 64, a fifth connection section 65, and a sixth connection section 66 that are connected sequentially. The fifth connection section 65 is connected between the fourth connection section 64 and the sixth connection section 66, the fourth connection section 64 is electrically connected to the third section 521, and the sixth connection section 66 is electrically connected to the fourth section 522, and both the fourth connection section 64 and the sixth connection section 66 extend in the first direction X.

The plurality of second compensation signal lines 70 are located in the display area AA and extend in the first direction X. An orthographic projection of the second compensation signal line 70 on the plane where the array substrate 100 is located does not overlap with an orthographic projection of the fourth connection section 64 on the plane where the array substrate is located, and does not overlap with an orthographic projection of the sixth connection section 66 on the plane where the array substrate 100 is located. At least a portion of the plurality of second compensation signal lines 70 is located on the extension of the second connection signal lines 60 in the first direction X. It should be understood that the second compensation signal lines 70 is provided in regions of the display area AA other than those regions where the fourth connection sections 64 and the sixth connection sections 66 are located.

In the embodiments of the present application, since at least a portion of the second connection signal lines 60 are provided in the display area AA but in a different film layer from the third category signal line s51, the number of the second connection signal lines 60 provided at an outer edge of the hole area Hole can be reduced, and even there is no the second connection signal line 60 at the outer edge of the hole area Hole. Therefore, the outer edge of the hole area Hole can be reduced, and the screen to-body ratio of the array substrate can be increased.

In addition, due to the fact that the second connection signal line 60 includes the fourth connection section 64 and the sixth connection section 66 that extend in the first direction X, wiring density in a region of the display area occupied by the fourth connection sections 64 and the sixth connection sections 66 in the first direction X is higher than that of other regions of the display area in the first direction X. Due to different wiring densities in different regions of the display area in the first direction, there may be issues such as uneven display (such as mura) when the array substrate drives light-emitting elements for display.

The array substrate according to the embodiments of the present application further includes the second compensation signal lines 70 which extend in the first direction X and located in regions of the display area AA other than those regions where the fourth connection sections 64 and the sixth connection sections 66 are located. At least a portion of the plurality of second compensation signal lines 70 is located on the extension of the second connection signal lines 60 in the first direction X. Further, the second compensation signal lines 70, the fourth connection sections 64 and the sixth connection sections 66 all extend along the first direction X, which results in a consistent wiring density through the entire display area AA in the first direction X, thereby avoiding the problem of uneven display (such as mura).

In some optional embodiments, in the second direction Y, a line spacing between adjacent second compensation signal lines 70, a line spacing between adjacent fourth connection section 64, and a line spacing between adjacent sixth connection section 66 are equal with each other, and a line width of the second compensation signal line 70, a line width of the fourth connection section 64, and a line width of the sixth connection section 66 are equal with each other.

That is to say, the plurality of second compensation signal lines 70, the plurality of fourth connection sections 64, and the plurality of sixth connection sections 66 are uniformly distributed in the second direction Y. Due to the fact that the second compensation signal lines 70, the fourth connection sections 64, and the sixth connection sections 66 all extend in the first direction X, have equal line widths and are distributed uniformly, wiring density of the entire display area AA in the second direction Y can be made further consistent.

Exemplarily, in the second direction Y, a line spacing between a second compensation signal line 70 and an adjacent fourth connection section 64 is equal to a line spacing between adjacent second compensation signal lines 70 and/or a line spacing between adjacent fourth connection sections 64. In the second direction Y, a line spacing between a second compensation signal line 70 and an adjacent sixth connection section 66 is equal to the line spacing between adjacent second compensation signal lines 70 and/or a line spacing between adjacent sixth connection section 66.

Exemplarily, the fourth connection section 64 and the sixth connection section 66 are respectively located on an extension line of the second compensation signal line 70. In other words, there are two second compensation signal lines 70 at both sides of the fourth connection section 64 and the sixth connection section 66 in the second direction Y, and an extension lines of the two second compensation signal lines 70 passes through the fourth connection section 64 and/or the sixth connection section 66.

Figure 10:
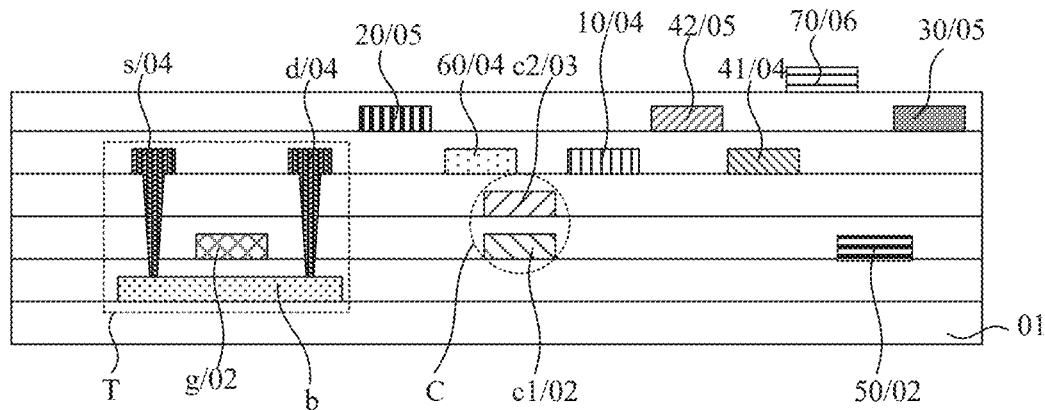
FIG. 10 shows a schematic sectional view along the B-B direction in FIG. 9.

In some optional embodiments, similarly, if the second compensation signal line 70 is not connected to other signal lines, parasitic capacitance will be generated between the second compensation signal line 70 and the other signal lines, affecting signal stability and thus display stability. As shown in FIG. 10, the second compensation signal line 70 is electrically connected to the second signal line 40 so as to avoid formation of parasitic capacitance by the second compensation signal line 70 and improve display stability. On the other hand, the second signal line 40 is a voltage signal line, which, after being electrically connected to the second compensation signal line 70, is thickened equivalently, thereby reducing the resistance of the second signal line 40 and thereby reducing the voltage drop (IR drop) of the second signal line 40.

As shown in FIG. 10, the second compensation signal line 70 is located in a different film layer from the second signal line 40.

Exemplarily, the array substrate 100 may include a substrate 01 and a first conductive layer 02, a second conductive layer 03, a third conductive layer 04, a fourth conductive layer 05, and a fifth conductive layer 06 which are stacked on one side of the substrate 01. Insulation layers are interpositioned between adjacent conductive layers. Exemplarily, a pixel driving circuit of the array substrate 100 includes a transistor T and a storage capacitor C. The transistor T includes a semiconductor b, a gate terminal g, a source terminal s, and a drain terminal d. The storage capacitor C includes a first electrode plate c1 and a second electrode plate c2. As an example, the gate terminal g and the first plate c1 may be located in the first conductive layer 02, the second plate c2 may be located in the second conductive layer 03, the source terminal s, the drain terminal d, the first signal line 10, and the first sub-signal line 41 may be located in the third conductive layer 04, and the first compensation signal line 30, the first connection signal line 20, and second sub-signal line 42 may be located in the fourth conductive layer 05.

For example, as shown in FIG. 10, the third signal line 50 may be located in the first conductive layer 02, and the second connection signal line 60 may be located in the third conductive layer 04. As another example, the third signal line 50 may be located in the third conductive layer 04, and the second connection signal line 60 may be located in the first conductive layer 02. The second compensation signal line 70 may be located in the fifth conductive layer 06, and the second compensation signal line 70 may be connected to the second sub signal line 42 through a through hole.

Figure 11:
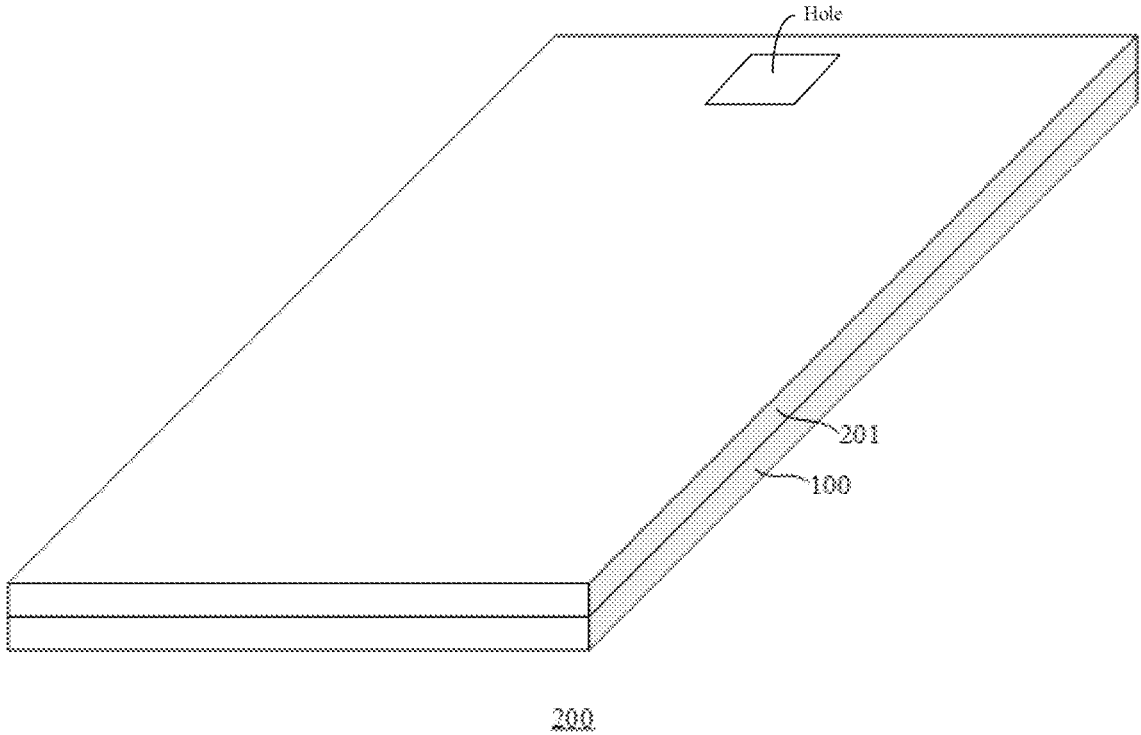
FIG. 11 shows a schematic structural diagram of a display panel according to an embodiment of the present application.

The embodiments of the present application embodiment further provides a display panel, including the array substrate as described according to any of the above embodiments. FIG. 11 shows a structural schematic diagram of a display panel according to an embodiment of the present application. As shown in FIG. 11, the display panel 200 includes the array substrate 100 as described according to any of the above embodiments and a light-emitting layer 201 on the array substrate 100. For example, the light-emitting layer 201 may be an organic light-emitting layer, that is, the display panel 200 may be an organic Light Emitting Diode (OLED) display panel.

The principle of solving problems by the display panel is similar to that of the aforementioned array substrate, so the display panel may be implemented by reference to the implementation of the aforementioned array substrate, which will not be repeated here.

The embodiment of the present application also provides a display device, including the display panel 200 as described in the above embodiment. The display device may be any electronic device with a display function, such as a mobile phone, a tablet computer, a laptop, an e-book, or a television.

According to the embodiments described in the present application, these embodiments do not describe all details completely, and do not limit the application to only the described specific embodiments. Obviously, based on the above description, various modifications and changes can be made. This specification selects and specifically describes these embodiments in order to better explain the principles and practical applications of the present application, so that those skilled in the art can make good use of the present application and modifications based on the present application. The present application is only limited by the claims and their full scope and equivalents.

What is claimed is:

1. An array substrate including a hole area and a display area which is partially surrounding the hole area, the array substrate comprising:
   a plurality of first signal lines located in the display area and including a plurality of first category signal lines and a plurality of second category signal lines, wherein each of the first category signal lines extends in a first direction, and each of the second category signal lines comprises a first section and a second section separated by the hole area and extending in the first direction;
   a plurality of first connection signal lines, at least a portion of which is located in the display area but in a different film layer from the first category signal lines, wherein each of the first connection signal lines comprises a first connection section, a second connection section and a third connection section that are connected sequentially, the second connection section is connected between the first connection section and the third connection section, the first connection section is electrically connected to the first section, the third connection section is electrically connected to the second section, and both the first connection section and the third connection section extend in a second direction; and
   A plurality of first compensation signal lines located in the display area and extending in the second direction, wherein at least a portion of the plurality of first compensation signal lines is collinear with the first connection section or the third connection section in the second direction.

2. The array substrate according to claim 1, wherein an orthogonal projection of the first compensation signal line on a plane where the array substrate is located does not overlap with an orthogonal projection of the first connection section on the plane, or the orthogonal projection of the first compensation signal line on the plane does not overlap with an orthogonal projection of the third connection section on the plane.

3. The array substrate according to claim 1, wherein at least a portion of the plurality first compensation signal lines is located between adjacent first connection sections, or at least a portion of the plurality first compensation signal lines is located between adjacent third connection sections.

4. The array substrate according to claim 1, wherein at least a portion of the plurality first compensation signal lines is aligned with the first connection section in the second direction, or at least a portion of the plurality first compensation signal lines is aligned with the third connection section in the second direction.

5. The array substrate according to claim 1, wherein the plurality of the first compensation signal lines, the first connection sections of the plurality of the first connection signal lines and the third connection sections of the plurality of the first connection signal lines are uniformly distributed in the display area along the first direction.

6. The array substrate according to claim 1, further comprising:
   a plurality of second signal lines located in the display area, wherein at least a portion of the plurality of first compensation signal lines is electrically connected to the second signal line, and the second signal line is a voltage signal line.

7. The array substrate according to claim 6, wherein the second signal line is a power signal line; and
   each of the second signal lines comprises a first sub-signal line and a second sub-signal line which are electrically connected to each other but located in different film layers, wherein at least a portion of the plurality of first compensation signal lines is located in a same film layer as and electrically connected to one of the first sub-signal line and the second sub-signal line.

8. The array substrate according to claim 7, wherein the first direction is a column direction, and the second direction is a row direction, the first signal line is a data signal line, and the second signal line extends in the first direction; and
   wherein the first signal line is located in a same film layer as the first sub-signal line but with a separation distance from the first sub-signal line, and the first compensation signal line and the first connection signal line are located in a same film layer as the second sub-signal line.

9. The array substrate according to claim 7, wherein the second sub-signal line comprises a first category sub-signal line and a second category sub-signal line, and the second category sub-signal line comprises a first sub-section and a second sub-section which are separated by the first connection signal line; and
   at least a portion of the second connection sections extends between the first sub-section and the second sub-section.

10. The array substrate according to claim 7, wherein the first compensation signal line comprises a first category compensation signal line and a second category compensation signal line;

the first category compensation signal line is located between the first connection signal line and the hole area, and is connected to the first connection signal line; and the second category compensation signal line is separated from the hole area by the first connection signal line, and is connected to the second sub-signal line.

11. The array substrate according to claim 6, wherein the first direction is a row direction, the second direction is a column direction, the first signal line is a scanning signal line, a light emission control signal line or a reference voltage signal line, and the second signal line extends in the second direction; and the first signal lines are located in a different film layer from the second signal lines.

12. The array substrate according to claim 6, wherein the first direction is a column direction, the second direction is a row direction and the first signal line is a data signal line, and wherein the array substrate further comprises:

a plurality of third signal lines which are scanning signal lines, light emission control signal lines or reference voltage signal lines, wherein the third signal lines comprise a plurality of third category signal lines and a plurality of fourth category signal lines, wherein each of the third category signal lines is located in the display area and extends in the second direction, and each of the fourth category signal lines comprises a third section and a fourth section separated by the hole area and extending in the second direction;

a plurality of second connection signal lines, at least a portion of which is located in the display area but in a different film layer from the third category signal lines, wherein each of the second connection signal lines comprises a fourth connection section, a fifth connection section and a sixth connection section that are connected sequentially, the fourth connection section is electrically connected to the third section, the sixth connection section is electrically connected to the fourth section, the fifth connection section is connected between the fourth connection section and the sixth connection section, and both the fourth connection section and the sixth connection section extend in the first direction; and a plurality of second compensation signal lines located in the display area and extending in the first direction, wherein at least a portion of the plurality of second compensation signal lines is located on the extension of the second connection signal lines in the first direction.

13. The array substrate according to claim 12, wherein the second compensation signal line is electrically connected to the second signal line.

14. The array substrate according to claim 12, wherein an orthogonal projection of the second compensation signal line on a plane where the array substrate is located does not overlap with an orthogonal projection of the fourth connection section on the plane, or the orthogonal projection of the second compensation signal line on the plane does not overlap with an orthogonal projection of the sixth connection section on the plane.

15. The array substrate according to claim 12, wherein in the second direction, a line spacing between adjacent second compensation signal lines, a line spacing between adjacent fourth connection sections, and a line spacing between adjacent sixth connection sections are equal with each other.

16. The array substrate according to claim 1, wherein in the first direction, a line spacing between adjacent first compensation signal lines, a line spacing between adjacent first connection sections, and a line spacing between adjacent third connection sections are equal with each other.

17. The array substrate according to claim 1, wherein a line width of the first compensation signal line, a line width of the first connection section, and a line width of the third connection section are equal with each other.

18. The array substrate according to claim 1, wherein in the first direction, a line spacing between a first compensation signal line and an adjacent first connection section is equal to a line spacing between adjacent first compensation signal lines and/or a line spacing between adjacent first connection sections; and in the first direction, a line spacing between a first compensation signal line and an adjacent third connection section is equal to the line spacing between adjacent first compensation signal lines or a line spacing between adjacent third connection sections.

19. A display panel, comprising the array substrate according to claim 1.

20. A display device, comprising the display panel according to claim 19.

* * * * *